(12) United States Patent
Oosono et al.

(10) Patent No.: US 7,696,683 B2
(45) Date of Patent: Apr. 13, 2010

(54) ORGANIC ELECTROLUMINESCENT ELEMENT AND THE MANUFACTURING METHOD

(75) Inventors: Tetsuo Oosono, Tokyo (JP); Akio Nakamura, Tokyo (JP); Tsunenori Komori, Tokyo (JP)

(73) Assignee: Toppan Printing Co., Ltd. (JP)

( * ) Notice: Subject to any disclaimer, the term of this patent is extended or adjusted under 35 U.S.C. 154(b) by 533 days.

(21) Appl. No.: 11/604,157

(22) Filed: Nov. 22, 2006

(65) Prior Publication Data

US 2007/0164666 A1  Jul. 19, 2007

(30) Foreign Application Priority Data

Jan. 19, 2006 (JP) .............................. 2006-010739
Apr. 20, 2006 (JP) .............................. 2006-116527

(51) Int. Cl.
H05B 33/00 (2006.01)
(52) U.S. Cl. ........................................ 313/503; 445/23
(58) Field of Classification Search ................. 313/483, 313/494, 498, 500, 501, 503, 504, 505, 506, 313/507; 445/23–24
See application file for complete search history.

(56) References Cited

U.S. PATENT DOCUMENTS

| | | | |
|---|---|---|---|
| 6,399,222 B2 * | 6/2002 | Arai et al. .................... 428/690 |
| 6,420,200 B1 | 7/2002 | Yamazaki et al. | |
| 6,582,504 B1 | 6/2003 | Fujita | |
| 7,141,817 B2 * | 11/2006 | Nishi et al. .................... 257/40 |
| 7,453,202 B2 * | 11/2008 | Suh et al. .................... 313/506 |
| 2002/0109458 A1 * | 8/2002 | Pichler et al. ............... 313/504 |
| 2004/0021413 A1 | 2/2004 | Ito et al. | |
| 2005/0158580 A1 * | 7/2005 | Ito et al. .................... 428/690 |
| 2007/0262705 A1 * | 11/2007 | Fukuda et al. .............. 313/504 |

FOREIGN PATENT DOCUMENTS

| | | |
|---|---|---|
| JP | 05-078655 | 3/1993 |
| JP | 05-109482 | 4/1993 |
| JP | 10-012377 | 1/1998 |
| JP | 10-077467 | 3/1998 |
| JP | 11-024604 | 1/1999 |
| JP | 2000-208253 | 7/2000 |
| JP | 2001-076873 | 3/2001 |
| JP | 2001-093668 | 4/2001 |
| JP | 2001-155858 | 6/2001 |
| JP | 2001-155861 | 6/2001 |
| JP | 2001-185360 | 7/2001 |
| JP | 2001-291587 | 10/2001 |
| JP | 2002-100472 | 4/2002 |
| JP | 2002-216950 | 8/2002 |
| JP | 2002-231443 | 8/2002 |
| JP | 2002-305077 | 10/2002 |

(Continued)

*Primary Examiner*—Joseph L Williams
*Assistant Examiner*—Brenitra M Lee
(74) *Attorney, Agent, or Firm*—Squire, Sanders & Dempsey L.L.P.

(57) ABSTRACT

One embodiment of an organic electroluminescent element of present invention includes a substrate, a first electrode on the substrate, an organic luminescent medium layer including an organic luminescent layer on the first electrode, a second electrode on the organic luminescent medium layer and barrier film formed on the second electrode. The organic luminescent medium layer is sandwiched between the first electrode and the second electrode. Film density of the barrier film changes in thickness direction.

15 Claims, 3 Drawing Sheets

FOREIGN PATENT DOCUMENTS

| | | |
|---|---|---|
| JP | 2002-313561 | 10/2002 |
| JP | 2003-059654 | 2/2003 |
| JP | 2003-059656 | 2/2003 |
| JP | 2003-243163 | 8/2003 |
| JP | 2003-282244 | 10/2003 |
| JP | 2003-303680 | 10/2003 |
| JP | 2004-055333 | 2/2004 |
| JP | 2004-063304 * | 2/2004 |
| JP | 2004-063359 | 2/2004 |
| JP | 2004-079292 | 3/2004 |
| JP | 2004-103442 | 4/2004 |
| JP | 2004-355913 | 12/2004 |
| WO | WO 99/10862 | 4/1999 |

* cited by examiner

//  ORGANIC ELECTROLUMINESCENT ELEMENT AND THE MANUFACTURING METHOD

CROSS REFERENCE

This application claims priority to Japanese application number 2006-10739, filed on Jan. 19, 2006, and priority to Japanese application number 2006-116527, filed on Apr. 20, 2006, which are incorporated herein by reference.

BACKGROUND OF THE INVENTION

1. Field of the Invention

The present invention is related to an organic electroluminescent element. It is expected that an organic electroluminescent element is used for wide variety of applications. Applications of an organic electroluminescent element include a flat panel display used in a television, a PC monitor, portable units such as a portable telephone, a surface emitting light source, an illumination, and a light emission type advertisement body.

2. Description of the Related Art

Because an organic electroluminescent element has the following merit, an organic electroluminescent element is expected as a flat panel display as a substitute for a CRT and a liquid crystal display.

1. Viewing angle is wide.

2. Response speed is fast.

3. Power consumption is low.

An organic electroluminescent element is explained below.

The organic luminescent medium layer is sandwiched between two electrode layers (an anode layer and a cathode layer). A cathode layer and/or an anode layer are transparent. An electric current flows by applying voltage between both electrodes. Then light emission occurs in an organic light emission medium layer.

As for the organic electroluminescent element, quality deteriorates due to influence of atmospheric water vapor and oxygen. Therefore, an organic electroluminescent element is shielded from the atmosphere by covering an organic electroluminescent element by a metal can or a glass cap containing a desiccant.

In late years a top emission organic electroluminescent element is proposed to improve takeout efficiency of light emission of an active matrix type organic electroluminescent element. In substitution for a conventional sealing by a glass cap containing a desiccant, a barrier film having barrier property is provided to an organic electroluminescent element. An adhesive and a transparent sealing substrate are further put on an organic electroluminescent element. (Patent Reference 1).

In addition, in an organic electroluminescent element using a plastic film as a substrate, a barrier film of which barrier property is excellent is needed to shield an organic electroluminescent element from the atmosphere.

A barrier film of an organic electroluminescent element must have superior barrier property. Therefore, an inorganic film made of silicon dioxide, silicon nitride or the like is generally used as a barrier film. However, while a film is influenced by a substratum, a film layers on a substratum. Film defects such as a cavity and a pinhole of a film inside or a crack of a film occur due to a projection of an electrode and a substrate, and a particle. Then even if a film is thickened, and another film is laminated on the film formed beforehand, film defects cannot be suppressed. In addition, an organic material included in a cathode and an organic luminescent medium layer is very easy to react with water or oxygen. As a result of occurrence of the reaction, a non-luminescent point as referred to as a dark spot occurs. Therefore a life time of an organic electroluminescent element shortens.

Unevenness of a substrate can be coated by inserting an organic resin layer between inorganic laminated films. In addition, a defect position of an inorganic laminated film can be shifted by shielding a defect occurring in an inorganic film by an organic resin film (Patent Reference 2).

However, it is necessary to prepare a film formation chamber for an organic resin film. Cleaning of an organic resin film formation chamber is difficult. A particle is easy to occur. Therefore, there is a problem in mass production.

In addition, in this method, a defect remains in each inorganic film. Therefore, if the number of layers of laminated films is less than about 5 or 6, barrier property of an organic electroluminescent element is not sufficient.

Generally, a thicker glass (this glass is named counterbored glass) of which central part is processed to a recess form is bonded to an organic electroluminescent element with an adhesive such as epoxy resin so that the glass covers the cathode upper part. (Patent Reference 3)

Then an organic electroluminescent element is shielded from outside water vapor or oxygen by a counterbored glass.

However, in technique with the use of this counterbored glass, thin organic electroluminescent element cannot be made.

On the other hand, a display unit having the following characteristic is hoped for as an information display terminal: large size; a great number of pixels; fast response speed; and low power consumption.

It is said that it is necessary to use the following organic electroluminescent element in order to make such a display unit: an active matrix drive (thin film transistor (TFT) is used.); and top emission structure (light is taken out from an opposite side of TFT substrate.)

In making this organic electroluminescent element of top emission type, when sealing by a metal can and a counterbored glass is performed, light cannot be taken out from a top face.

Thus a method how an electrode is coated by a polymer film with a transparent barrier film is proposed. (Patent Reference 4)

However, it is necessary to form a thin film on a polymer film to raise barrier property of a polymer film itself when an electrode is coated by a polymer film. Therefore, the number of the processes increases. In addition, when a polymer film is stuck on an electrode, a bubble remains in a boundary surface. An organic electroluminescent element suffers damage by active gas inside a bubble.

Therefore, as a protection plate, the member which an adhesive is applied to a flat glass is used. And an organic electroluminescent element is sealed by sticking a protection plate on a cathode. (Patent Reference 5)

In this organic electroluminescent element, the surface of an organic electroluminescent element is covered by a rigid glass plate. Therefore, this organic electroluminescent element is superior in mechanical strength. In addition, manufacturing this organic electroluminescent element is easy. However, water vapor permeability of an adhesive itself is high. Therefore, this sealing method is inferior to a conventional sealing method using a cap. Moistureproofness of an organic electroluminescent element can be improved by mixing a desiccant with an adhesive (Patent Reference 6).

However, it has not resulted in fundamental solution.

In order to solve the above mentioned problem, a method how a protective film is formed on an organic electroluminescent element before applying an adhesive on an organic electroluminescent element is proposed. From a good balance between transparency and barrier property, inorganic material such as $Al_2O_3$, $SiO_2$ and $Si_3N_4$ is usually used as a barrier film.

However, an organic electroluminescent element deteriorates when sealing ability of a barrier film is not sufficient. In other words this barrier film is a barrier film which is insufficient for a protective layer of an organic electroluminescent element.

Therefore, the conventionally proposed protective layer of an organic electroluminescent element with the use of a flat glass is insufficient for a seal of an organic electroluminescent element.

The present invention provides a barrier film superior in barrier property without a defect. In addition, the present invention provides an organic electroluminescent element without the occurrence and enlargement of a defect for a long term with the use of this barrier film.

In addition, according to the present invention, a barrier film which has hygroscopic property and water-vapor-proofing property can be easily formed. In addition, the present invention provides an excellent thin organic electroluminescent element without aged deterioration and the manufacturing method.

Patent Reference 1: Japanese Patent Laid-Open No. 2002-231443 Official Gazette

Patent Reference 2: Japanese Patent Laid-Open No. 2004-103442 Official Gazette

Patent Reference 3: Japanese Patent Laid-Open No. 05-109482 Official Gazette

Patent Reference 4: Japanese Patent Laid-Open No. 2004-79292 Official Gazette

Patent Reference 5: Japanese Patent Laid-Open No. 2002-216950 Official Gazette

Patent Reference 6: Japanese Patent Laid-Open No. 2003-303680 Official. Gazette

SUMMARY OF THE INVENTION

One embodiment of an organic electroluminescent element of present invention includes a substrate, a first electrode on the substrate, an organic luminescent medium layer including an organic luminescent layer on the first electrode, a second electrode on the organic luminescent medium layer and barrier film formed on the second electrode. The organic luminescent medium layer is sandwiched between the first electrode and the second electrode. Film density of the barrier film changes in thickness direction.

In these drawings, 1 is a substrate; 2 is a first electrode; 3 is an organic luminescent medium layer; 4 is a second electrode; 5 is a barrier film; 5a is a water-vapor-proofing silicon nitride film; 5b is an easily oxidative silicon nitride film; 7 and 9 each are a sealing substrate; 8 is an organic electroluminescent element; and 17 is a protective layer.

DESCRIPTION OF THE PREFERRED EMBODIMENTS

Figure 1:
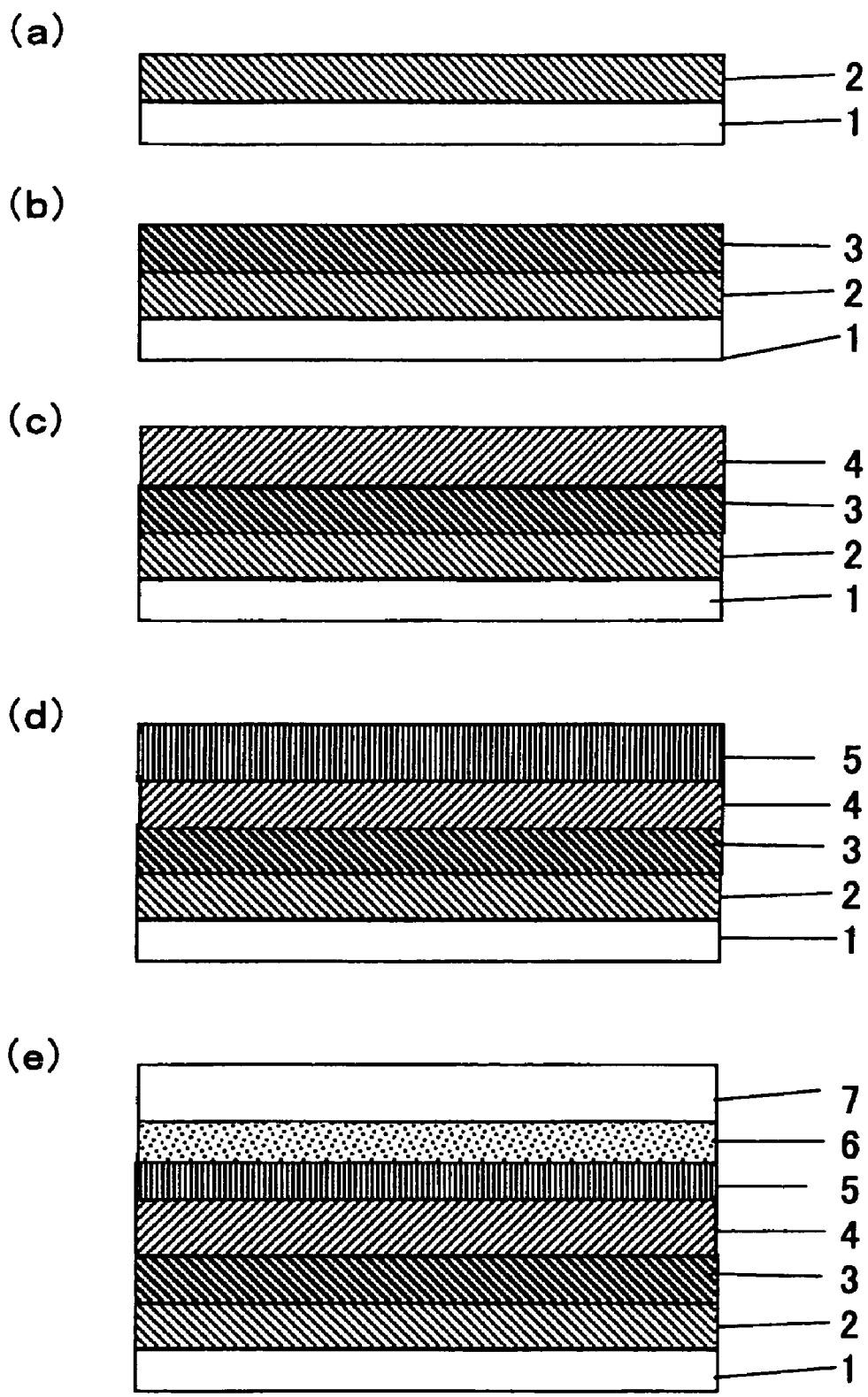
FIGS. 1(a), (b), (c), (d) and (e) are sectional side elevations that show a manufacturing method of an organic electroluminescent element of an embodiment of the present invention.

One embodiment of an organic electroluminescent element and the manufacturing method of the present invention are explained in FIG. 1. However, the present invention is not limited to this embodiment.

Organic luminescent medium layer 3 including a luminescent layer can be sandwiched between first electrode 2 and second electrode 4. When voltage is applied between these electrodes, a hole injected from one electrode and an electron injected from the other electrode recombine in a luminescent layer. Light emission at this time is used for an information display and a light source.

An organic electroluminescent element which substrate 1, first electrode 2, organic luminescent medium layer 3, second electrode 4, barrier film 5 and a protection plate is laminated in this order is explained as an example of an organic electroluminescent element of the present invention.

First electrode 2 is anode. Second electrode 4 is cathode. However, the present invention is not limited to an organic electroluminescent element of this structure.

It is preferable to select a material of substrate 1 according to take-out direction of emitted light. For example, glass and quartz can be used when light is taken out from substrate 1 side.

In addition, a plastic film and sheet such as polypropylene, polyether sulfone, polycarbonate, cyclo-olefin polymers, polyalylate, a polyamide, polymethyl methacrylate, polyethylene terephthalate and polyethylenenaphthalate can be used.

In addition, a translucent substrate having metallic oxide such as silicon dioxide or aluminium oxide, metal fluoride such as aluminum fluoride or magnesium fluoride, metal nitrides such as silicon nitride or aluminum nitride, metal oxynitride such as silicon oxide nitride and polymer resin film such as acryl resin, epoxy resin, silicone resin or polyester resin on a plastic film and sheet can be used.

The above mentioned layer(s) formed on a plastic film and sheet is monolayer or plural layers.

In addition, when light is not taken out from substrate 1 side, a metal foil and sheet such as an aluminium or stainless steel and a silicon substrate can be used besides the above mentioned translucent substrate.

In addition, a non-translucent substrate that a metal film such as aluminium, copper, nickel or stainless steel is formed on the plastic film and sheet can be used.

The driving substrate which a thin film transistor (TFT) is formed on a substrate beforehand may be used if necessary.

For TFT, organic TFT made of polythiophene, polyaniline, copper phthalocyanine or perylenes may be used. TFT comprising amorphous silicon and poly Si may be used.

For a driving method of an organic electroluminescent element, a passive matrix method and an active matrix method can be used.

A passive matrix method is explained below. Stripe shaped electrodes face to each other so that a stripe shaped electrode in one side is perpendicular to a stripe shaped electrode in the other side. In the intersecting point, it emits light.

An active matrix method is explained below. So-called TFT substrate that a thin film transistor (TFT) is formed every pixel is used. It emits light every pixel independently.

In addition, it is preferable for a substrate to be heated beforehand. Water-vapor adsorbed in internal and surface of a substrate is reduced by heating. In addition, depending on material laminated on a substrate, surface of a substrate may be processed by processing such as ultrasonic cleaning processing, corona discharge treatment, plasma treatment and UV ozonization for improvement of adhesion.

In addition, a color filter layer, a light scattering layer, a light deflection layer or a flattening layer may be formed on a substrate if necessary.

First electrode 2 is layered on substrate 1. Patterning of first electrode 2 is performed if necessary. (FIG. 1(a))

First electrode 2 may be hole injection electrode. In addition, first electrode 2 may be electron injection electrode.

In addition, according to take-out direction of emitted light, first electrode 2 is selected from a transparent electrode and a reflective electrode.

An embodiment of a transparent hole injection electrode is explained below.

As a transparent hole injection electrode material, the following materials can be used: Metallic oxide such as indium oxide or tin oxide; Metal complex oxide such as ITO (indium tin oxide), indium zinc oxide or zinc aluminium oxide; Metallic material such as gold or platinum; and Fine particle dispersion film (monolayer or plural layers) that a fine particle of the above mentioned metallic oxide and metallic material disperses in epoxy resin or acryl resin.

In addition, metallic material such as copper or aluminium may be provided along the first electrode 2 as a supporting electrode to lower wiring resistance of first electrode 2 if necessary.

According to a material of first electrode 2, the following formation method of first electrode 2 can be used: Dry coating methods such as resistance heating evaporation method, electron-beam evaporation technique, reactive evaporation method, ion plating method or a sputtering method; and Wet coating methods such as gravure printing or screen printing.

According to a material and a film formation method of first electrode 2, the following patterning method of first electrode 2 can be used: Conventional patterning method such as mask evaporation method, photo-lithography method, wet chemical etching method or dry etching method.

As a material of first electrode 2, the following materials can be used: ITO (indium tin oxide) and indium zinc oxide; Metal complex oxide such as zinc aluminium complex oxide; Metallic material such as gold or platinum; and Fine particle dispersion film (monolayer or plural layers) that a fine particle of the above mentioned metallic oxide and metallic material disperses in epoxy resin or acryl resin.

In addition, a metallic material such as copper or aluminium may be provided along first electrode 2 as a supporting electrode to lower wiring resistance of first electrode 2 if necessary.

Organic luminescent medium layer 3 including an organic luminescent layer is formed next (FIG. 1(b)).

Organic luminescent medium layer 3 can include one organic luminescent layer including luminescent material or plural layers including an organic luminescent layer. When organic luminescent medium layer 3 comprises plural layers, the following plural layers can be used: A two-layer comprising a hole transport layer and an organic luminescent layer having electron transport property; A two-layer comprising an organic luminescent layer having hole transport property and an electron transport layer; and Three layers comprising a hole transport layer, an organic luminescent layer and an electron transport layer.

It is further desirable to increase the number of layers if necessary, for example, a hole injection function and a hole transport function are divided. In addition, when an electron injection function and an electron transport function are divided. In addition, when a layer blocking the hole transport is inserted. In addition, when a layer blocking the electron transport is inserted.

Representative examples of a hole transport material, comprising a hole transport layer, include copper phthalocyanine, metallophthalocyanine such as tetra(t-butyl) copper phthalocyanine, metal-free phthalocyanine, quinacridon chemical compound, aromatic amine type low molecular hole injection transportation material such as N,N'-di(1-naphthyl)-N,N'-diphenyl-1,1'-biphenyl-4,4'-diamine, 1,1-bis(4-di-p-tolylamino phenyl) cyclohexane, N,N'-diphenyl-N,N'-bis(3-methylphenyl)-1,1'-biphenyl-4,4'-diamine, macromolecule hole transport materials such as polyaniline (PANI), polythiophene, polyvinylcarbazole, mixture with poly (3,4-ethylenedioxy thiophene) (PEDOT) and polystyrene sulfonate, polythiophene oligomer material, and other existing hole transport materials.

The organic luminescent material can include low molecular type organic luminescent material and high molecular form organic luminescent material. Representative embodiments of luminescent materials include the following:

9,10-diaryl anthracenes, pyrene, coronene, perylene, rubrene, 1,1,4,4-tetra phenylbutadiene, tris(8-quinolinolate) aluminium complex, tris (4-carbinyl-8-quinolinolate) aluminium complex, bis(8-quinolinolate) zinc complex, tris (4-carbinyl-5-trifluoromethyl-8-quinolinolate) aluminium complex, tris(4-carbinyl-5-cyano-8-quinolinate) aluminium complex, bis(2-carbinyl-5trifluoromethyl-8-quinolinolate) [4-(4-cyanophenyl) phenolate] aluminium complex, bis(2-carbinyl-5-cyano-8-quinolinolate)[4-(4-cyanophenyl) phenolate] aluminium complex, tris(8-quinolinolate) scandium complex, bis [8-(para-tosyl)aminoquinoline]zinc complex and cadmium complex, 1,2,3,4-tetraphenylcyclopentadiene, the pentaphenyl cyclopentadiene, poly-2,5-dihetyloxi-paraphenylenevinylene, chroma phosphorus type fluorescent substance, the perylene type fluorescent substance, the pyran type fluorescent substance, the anthrone type fluorescent substance, the porphyrin type fluorescent substance, the quinacridon type fluorescent substance, N,N'-dialkyl displacement quinacridon type fluorescent substance, the naphthalimido type fluorescent substance, N,N'-diaryl displacement pyrrolo pyrrole series fluorescent substance, low molecular system luminescent material such as phosphorescence fluor such as Ir chelate, high polymer materials such as poly arylene type, poly arylenevinylene type, poly fluorene, polyparaphenylene vinylene, polythiophene, polyspiro, the material which the low molecular material is dispersed in these high polymer materials, or the material which inter-polymerization of the low molecular material with these high polymer materials was done, the material which low molecular system luminescent material is scattered in high polymer materials such as polystyrene, polymethyl methacrylate, polyvinylcarbazole, existing macromolecule/low molecular luminescent material.

Representative examples of an electron transport material include 2-(4-biphenyl)-5-(4-t-butylphenyl)-1,3,4 oxadiazole, 2,5-bis(1-naphthyl)-1,3,4-oxadiazole, Oxadiazoles, Bis(10-hydroxybenzo[h]quinolinate) beryllium complex, triazole compound, and combinations thereof.

Film thickness of an organic electroluminescent medium layer 3 can be lower than 1,000 nm, and preferably it is 50-150 nm (the layer 3 is monolayer or plural layers).

As for the hole transport material of an organic electroluminescent element, covering of the surface protrusions of the substrate and anode is particularly important. Therefore, it is preferable to form a film of around 50-100 nm.

For a formation method of organic luminescence medium layer 3, depending on the material comprising each layer, the following method can be used:

Vacuum evaporation; coating methods or printing methods such as spin coat, spray coat, flexo, gravure, microgravure and intaglio offset; and ink jet method.

When solution of material comprising the organic luminescence medium layer is made, depending on the formation method, it is desirable to control vapor pressure, solids content rate and viscosity of solvent.

For solvent, water, dimethylbenzene, anisole, cyclohexanone, mesitylene, tetralin, cyclohexylbenzene, methyl benzoate, ethyl benzoate, toluene, ethanol, acetone, methyl ethyl ketone, methyl isobutyl ketone, methanol, isopropyl alcohol, ethyl acetate and butyl acetate can be used. Even mixed solvent comprising these materials is preferable.

In addition, to improve coating performance, it is preferred to mix an appropriate amount of additive such as detergent, antioxidant, viscosity modifier and UV absorber with the solution if necessary.

Second electrode 4 can be formed next as illustrated by FIG. 3(c).

The material of second electrode 4 can be of a type with high electron injection efficiency to an organic luminescent medium layer.

In some embodiments, second electrode 4 can include a metal such as Mg, Al, Yb and combination of the same.

In addition, the following layer stack may be put in a boundary surface of the luminescent medium. The layer stack comprises a layer of 1 nm thickness made of Li or chemical compound such as oxidation Li and LiF and a layer made of Al or Cu of which stability and conductivity are high. Stability should be balanced with electron injection efficiency. Therefore an alloy system may be used. Alloy of one or more kind of metal such as Li, Mg, Ca, Sr, La, Ce, Er, Eu, Sc, Y, and Yb that have a low work function, and metallic element such as Ag, Al, and Cu which are stable can be used. In some embodiments, alloy such as MgAg, AlLi, and CuLi can be used.

It is desirable to select a material having transparency in so-called top emission construction so as to allow visible radiation to come out of the second electrode side. In this case, Li and Ca of a low work function are provided with thin measurements. Metal complex oxide such as ITO (indium tin oxide) and indium zinc oxide, zinc aluminium complex oxide may be laminated thereafter. In addition, a little metal doping such as Li and Ca of a low work function can be performed to organic luminous layer 3, and metal compound such as ITO may be laminated.

In the case of a top emission type, a material of second electrode 4 may be hole injection material. In addition, a material of second electrode 4 may be electron injection material.

In addition, according to take-out direction of emitted light, second electrode 4 is chosen among a transparent electrode and a reflective electrode.

An embodiment of non-transparent electron injection electrode is explained below.

The material of an electron injection electrode can be of a type with high electron injection efficiency to organic luminescent medium layer 3.

In some embodiments, an electron injection electrode can include a metal such as Mg, Al, Yb and combination of the same.

In addition, the following layer stack may be put in a boundary surface of the luminescent medium. The layer stack comprises a layer of 1 nm thickness made of Li or chemical compound such as oxidation Li and LiF and a layer made of Al or Cu of which stability and conductivity are high. Stability should be balanced with electron injection efficiency. Therefore an alloy system may be used. Alloy of one or more kind of metal such as Li, Mg, Ca, Sr, La, Ce, Er, Eu, Sc, Y, and Yb that have a low work function, and metallic element such as Ag, Al, and Cu which are stable can be used. In some embodiments, alloy such as MgAg, AlLi, and CuLi can be used.

It is desirable to select a material having transparency in so-called top emission construction so as to allow visible radiation to come out of electron injection electrode side. In this case, Li and Ca of a low work function are provided with thin measurements. Metal complex oxide such as ITO (indium tin oxide) and indium zinc complex oxide, zinc aluminium complex oxide may be laminated thereafter. In addition, a little metal doping such as Li and Ca of a low work function can be performed to organic luminous layer 3, and metal compound such as ITO may be laminated.

Depending on the material, for the formation of the second electrode 4, methods such as resistance heat evaporation by vaporization, electron beam evaporation, reactive deposition, ion plating and sputtering can be used.

For the second electrode, thickness of about 10 nm-1,000 nm is desirable to secure enough ohmic value.

When the second electrode is used as a transparent electron injection layer, and metal material such as Ca and Li are used, the thickness should be 0.1-10 nm.

Barrier film 5 is formed next (FIG. 1 (d)). Barrier film 5 prevents deterioration of an organic luminescent layer, a first electrode and a second electrode due to infiltration of water vapor and oxygen from the outside to organic electroluminescent element inside.

Barrier Film

The First Embodiment

The following barrier film can be used: Metallic oxide such as silicon dioxide or aluminium oxide; Metal fluoride such as aluminum fluoride or magnesium fluoride; Metal nitrides such as silicon nitride or aluminum nitride; Metal oxynitride such as silicon oxide nitride; and Metal carbide such as silicon carbide.

Especially it is preferable to use silicon nitride, silicon dioxide and silicon oxynitride which are superior in barrier properties. Especially silicon nitride is preferable from the viewpoint of barrier property.

In addition, as for silicon nitride, silicon dioxide and silicon oxynitride, depending on the kind of a film formation method, hydrogen and carbon may be included in a film. However, these barrier films can be used if necessary.

According to a material of a barrier film, the following formation method of a barrier film can be used: Resistance heating evaporation method, electron-beam evaporation method, reactive evaporation method, ion plating method, a sputtering method and CVD method.

Especially it is preferable to use CVD method from the viewpoint of barrier property. The following CVD method can be used: thermal CVD method, plasma enhanced CVD method, Catalytic CVD method and VUV-CVD method.

In addition, reactant gas in CVD method is explained below. Gas such as $N_2$, $O_2$, $NH_3$, $H_2$ or $N_2O$ can be added to organosilane such as mono-silane, disilane, hexamethyldisilazane (HMDS) or tetraethoxysilane if necessary. In addition, according to a kind of a reactant gas, hydrogen and carbon remain in a barrier film.

The desirable film thickness of a barrier film changes depending on the step of an electrode, the height of a partition wall or the required barrier properties. It is preferable for film thickness of a barrier film to be 10 nm-10 μm. Besides, 100 nm-1,000 nm are more preferable.

Film density of a barrier film in thickness direction changes. Film density of a barrier film of second electrode side is smaller than film density of a barrier film of substrate side. For example, high-density barrier film having barrier property is formed on a second electrode. Then barrier film defects such as a cavity in the film, a pinhole or a crack are easy to occur. These film defects are caused by uneven shapes such as a step or a projection in a surface and an edge of a second electrode which is a substratum. Therefore a low density protective film is formed on a second electrode. Then this low density barrier film which is a substratum flattens the uneven shapes. Therefore, the film defects such as a cavity in a barrier film, a pinhole or a crack is hard to occur. However, when only a low density barrier film is used, sufficient barrier property cannot be achieved. Therefore, after a low density barrier film is formed, a high-density barrier film is formed. In this time, a high-density barrier film is formed on a barrier film which flattens the uneven shapes. Therefore, a barrier film without film defects such as a cavity in a film, a pinhole or a crack, which is superior in barrier property, can be obtained.

Some embodiments of a barrier film are described below: A density gradient film of which density varies from a low density area of second electrode side to a high-density area of substrate side; and Laminated films of a low density film and a high-density film.

In order to control film density, it is necessary to adjust a film formation condition depending on the film formation method and the kind of a barrier film.

For example, easily control of film density is possible by the following method when silicon nitride film is layered by plasma enhanced CVD technique: A flow ratio of monosilane is changed; and All gas pressure in film formation is changed.

Thus, by the above mentioned method, the following barrier film can be formed: The density gradient barrier film of which density varies from low to high; The barrier film comprising laminated films of a low density film and a high-density film. In other words a barrier film of the present invention can be layered easily by changing a film formation condition in a film formation process.

Densities for a low density film differ depending on a kind of a barrier film. It is preferable for density of silicon nitride film to be 2.1-2.6 $g/cm^3$. (Density of ideal silicon nitride ($Si_3N_4$) is 3.2 $g/cm^3$.) Besides, it is more preferable to be 2.2-2.5 $g/cm^3$.

If density is lower than 2.1 $g/cm^3$, a film peeling and a crack occur because film is too fragile. If density is higher than 2.6 $g/cm^3$, an effect of coating a step and unevenness is not observed.

As measuring method of film density, X-ray reflectance method can be used. However, measuring method of film density is not limited to this method.

The desirable film thickness of barrier film 5 changes depending on the step of electrode, the height of a partition wall or the required barrier properties. It is preferable for film thickness of barrier film 5 to be 10 nm-10 μm. Besides, 100 nm-1,000 nm are preferable.

Especially it is desirable that film thickness of a low density film is equal to or more than thickness of cathode layers 4.

Film thickness of a high-density barrier film formed on a low density film had better be equal to or more than 10 nm.

In addition, in the case barrier film 5 should be thickened, it is not preferable to layer both a low density film and a high-density barrier film thick. When barrier film 5 is thickened by increasing the number of layers of laminated films, a high effect is achieved.

In addition, film peeling of an organic electroluminescent element occurs if absolute value of residual film stress of barrier film 5 is high. For this case, barrier property is lost. Therefore, it is desirable that film stress of a low density film is equal to or less than 100 MPa. Besides, absolute value of the whole multiplied film stress in barrier film 5 which is laminated films of a low density film and a high-density film had better be lower than 100 MPa.

For measuring method of film stress and residual film stress, well-known method can be used. For example, a method finding a stress from a bend of layered substrate and a method using X-ray diffraction can be used.

Damage of a barrier film by an outside impact can be prevented by forming sealing substrate 7 through adhesive 6 (FIG. 1(e)). Because barrier film 5 is formed on an organic electroluminescent element, it is not necessary to perform conventional cap sealing containing desiccant.

Besides, light can be taken out from sealing substrate side when a transparent substrate is used for sealing substrate 7. But, in the case of an organic electroluminescent element of conventional bottom emission type, sealing substrate 7 does not have to be glass. In other words metallic foil and sheet made of Al or the like and a plastic film on which metal is deposited can be used. In addition, a barrier film on which inorganic oxide film and inorganic nitride are layered can be used.

For adhesive 6, the following material can be used: A photo-curing type adhesiveness resin and a heat curing type adhesiveness resin comprising epoxy resin, acryl resin and silicone resin; A thermoplasticity adhesiveness resin comprising acid modified matter of polyethylen, polypropylene or the like.

For formation method of adhesive 6, depending on the material and the pattern of an adhesive, coating methods and printing methods such as a spin coat, a spraying coat, a flexography, a gravure, a micro gravure, a intaglio offset, and an ink jet process, a lamination method or a transfer method can be used.

Thickness of adhesive 6 is not limited especially. The thinner adhesive 6 is, the less transmission quantity of water vapor is. Therefore, it is preferable for the thickness of adhesive 6 to be about 5-50 μm.

Barrier Film

The Second Embodiment

For barrier film 5, easily oxidative silicon nitride film 5b and water-vapor-proofing silicon nitride film 5a are used. Balancing high barrier property and transparency is possible by using a silicon nitride film as a main film of barrier film 5. Therefore, light can be taken out from sealing substrate 9 side.

In addition, sputtering, photo-assisted CVD and plasma enhanced CVD can be used for film production technique.

Plasma enhanced CVD is the most desirable in this application. In plasma enhanced CVD technique, all the reaction generating film-forming seed takes place in gas phase. Therefore, it is not necessary for a reaction to be caused in a substrate surface. Therefore, plasma enhanced CVD is most suitable for low temperature film forming method needed in this application. Besides, a thin film can be formed in various conditions by controlling a gaseous flow rate, temperature of a substrate, gas pressure in a film production or input power.

In the present invention, easily oxidative silicon nitride film and water-vapor-proofing silicon nitride film can be made easily by controlling a flow rate of source gas and temperature of a substrate.

Easily oxidative silicon nitride film 5b means the following film: Under high temperature and high humidity condition (e.g. 85 degrees Celsius 90% RH) for a short time (about 24 hours) after a film production, a film is oxidized by absorbing water vapor. In other words silicon nitride film changes to nitrided silicon oxide film.

Easily oxidative silicon nitride film can be made by changing a condition at the time of a film production by CVD. Easily oxidative silicon nitride film can be formed by reducing a hydric flow rate in case with the use of plasma enhanced CVD technique and with the use of silane, ammonia, nitrogen and hydrogen as source gas. In addition, easily oxidative silicon nitride film is formed in the case that temperature of a substrate in a film production is from a room temperature to 100 degrees Celsius.

Water-vapor-proofing silicon nitride film 5a means the following film: After a film production, film does not change under high temperature and high humidity condition (e.g., 85 degrees Celsius 90% RH) for 1000 hours; In addition, water-vapor transmission of a film is equal to or less than $10^{-2}$ g/m$^2$/day.

Water-vapor-proofing silicon nitride film 5a can be made by adjusting a film production condition. Silicon nitride film can be made using silane, ammonia and nitrogen by plasma enhanced CVD technique. In this method, water-vapor-proofing property of silicon nitride film improves by further adding hydrogen. In addition, when temperature at film formation is high, water-vapor-proofing silicon nitride film 5a can be formed. But organic luminescent material must not be damaged by high temperature atmosphere.

In addition, it is desirable that water-vapor-proofing silicon nitride film 5a and easily oxidative silicon nitride film 5b are laminated in this order from substrate 1 side. Water vapor entering from an adhesive side is absorbed by easily oxidative silicon nitride film 5b. The water vapor which is not absorbed by easily oxidative silicon nitride film 5b is shielded by water-vapor-proofing silicon nitride film 5a. Therefore, water vapor does not arrive at an organic electroluminescent element.

In addition, laminating may be repeated a lot. However, if laminating is repeated about twice, a barrier film gives adequate performance.

Figure 3:
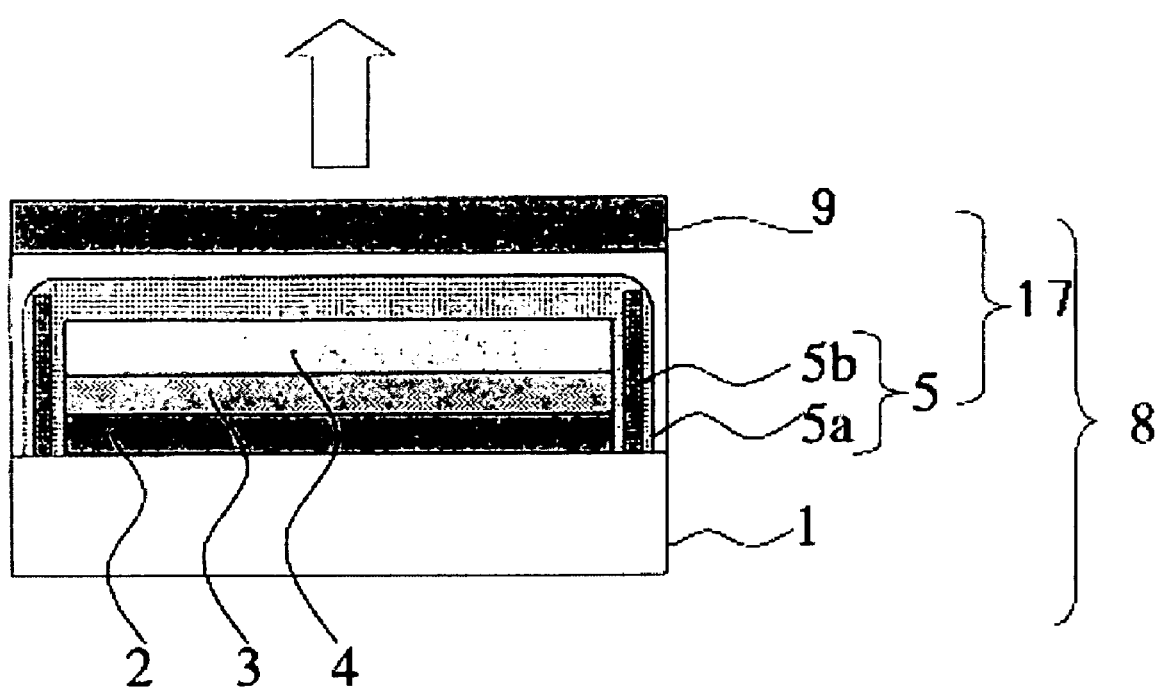
FIG. 3 is a section view of an organic electroluminescent element of an embodiment of the present invention including an easily oxidative silicon nitride film patterned in the shape of a frame.

Another embodiment of barrier film 5 is explained in FIG. 3. Easily oxidative silicon nitride film 5b is patterned in the shape of a frame so that easily oxidative silicon nitride film 5b surrounds an organic luminescent medium layer. Water-vapor-proofing silicon nitride film 5a is formed so that water-vapor-proofing silicon nitride film 5a coats easily oxidative silicon nitride film 5b and an organic electroluminescent element. Water vapor entering from adhesive edge face is absorbed by easily oxidative silicon nitride film 5b. Besides, water-vapor-proofing silicon nitride film 5a formed in an inside and a top face of easily oxidative silicon nitride film 5b prevents water vapor from arriving at an organic electroluminescent element.

Besides, thickness of barrier film 5 is not limited especially. However, as for the thickness of water-vapor-proofing silicon nitride film 5a, around 100-500 nm are desirable. As for the thickness of easily oxidative silicon nitride film 5b, around 50-300 nm are desirable. For this case, water-vapor-proofing silicon nitride film can supplement defect such as pinholes of a film itself. Therefore, oxygen barrier property and water-vapor barrier property improve greatly.

In addition, as for the easily oxidative silicon nitride film, the above mentioned film thickness is desirable to diminish influence of volume change before and behind oxidation by absorbing water vapor.

As for the film thickness of easily oxidative silicon nitride film 5b placed in the shape of a frame, around 1-5 μm are desirable. For this case, water vapor entering, from edge face can be captured.

Sealing substrate 9 (a protection plate) are put on barrier film 5 next. Barrier property of an organic electroluminescent element further improves by putting sealing substrate 9. An organic electroluminescent element can further have resistance to the mechanical damage. Only barrier film 5 does not have such a strong resistance.

For a protection plate, glass, and plastic sheet and plate on which water vapor proof processing is performed can be used. A glass substrate is preferable from the viewpoint of water-vapor-proofing property.

When sealing substrate 9 is put on a barrier film, an adhesive may be applied to whole area of sealing substrate 9. An adhesive may be applied to periphery of sealing substrate 9. In addition, heat transfer of a sheet adhesive may be performed.

For material of an adhesive, the following materials can be used: A photo-curing type adhesiveness resin, a heat curing type adhesiveness resin and a two-pack curing type adhesiveness resin comprising an epoxy resin, an acrylic resin and a silicon film resin; and thermoplasticity adhesiveness resins comprising acid modified matter of polyethylen, polypropylene or the like. (An adhesive is monolayer or plural layers.)

Especially it is desirable to use an epoxy system heat curing type adhesiveness resin which shrinks little at the time of hardening and which is superior in humidity resistance and water resistance.

In addition, desiccant such as barium oxide or calcium oxide may be mixed with an adhesive to remove water content in adhesive inside. In addition, an inorganic filler of around several % may be mixed with an adhesive to control thickness of an adhesive. But desiccant and inorganic filler must not disturb light transmission in an adhesive.

A protection plate with an adhesive made in this way is put on an organic electroluminescent element. And an adhesive layer is stiffened. It is desirable to perform a series of protective layer formation processes under nitrogen atmosphere. In addition, a protective layer formation process may be performed under an atmosphere in a short time after barrier film 5 is made.

Figure 2:
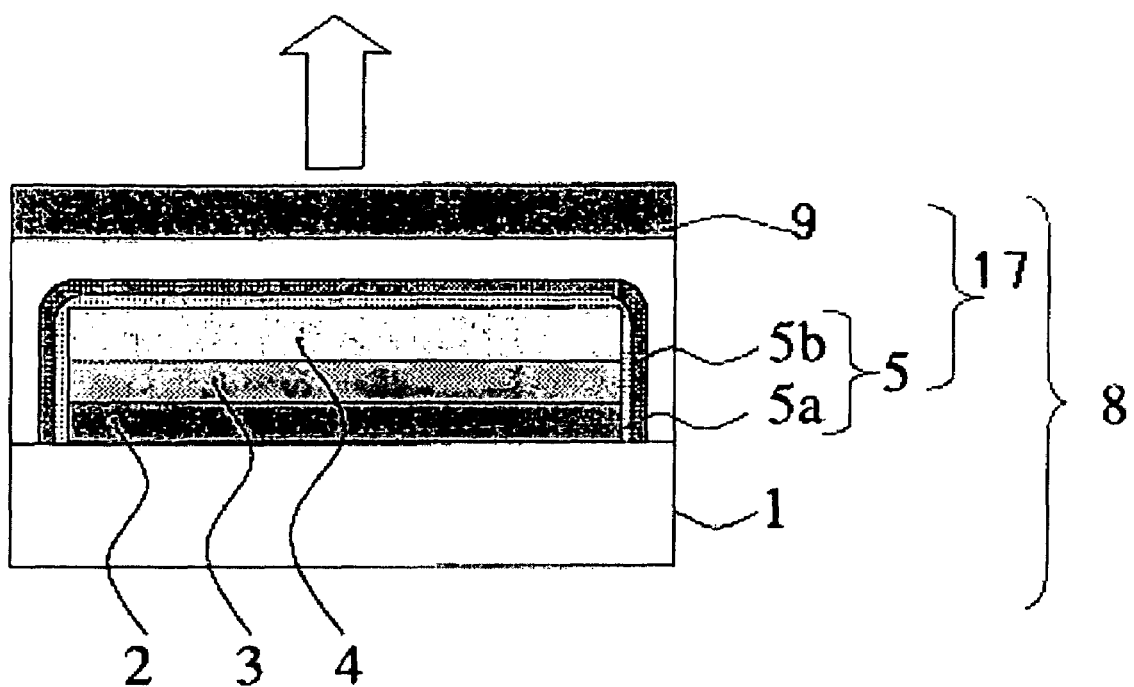
FIG. 2 is a sectional drawing of an organic electroluminescent element of an embodiment of the present invention including a barrier film that is a laminate of a water-vapor-proofing silicon nitride film and an oxidative silicon nitride film.

Protective layer 17 can be formed on second electrode 4 (cf. FIG. 2). Protective layer 17 consists of barrier film 5 and protection plate 9. Protective layer 17 protects cathode metal and an organic electroluminescent element from outside water-vapor and oxygen or mechanical damage.

In other words protective layer 17 prevents deterioration of an organic electroluminescent element.

According to the current invention, display light can be taken out from both a top face of a substrate and a bottom surface of a substrate. According to the current invention, the organic electroluminescent element which can emit light stably for the long term can be made easily.

EXAMPLE 1

Glass was used for substrate 1. The ITO film of which thickness was 150 nm was formed on substrate 1 as a first electrode by a sputtering method. Patterning of ITO film was performed using photo-lithography etching method.

Organic luminescent medium layer 3 was made next. A mixture of poly (3,4-ethylenedioxy thiophen) and polystyrene sulfonate was used as a hole transport layer (thickness: 20 nm). Poly [2-methoxy-5-(2'-ethyl-hexyloxy)-1,4-phenylenevinylene] (MEHPPV) was used as an organic luminescent layer(thickness: 100 nm). Each layer was formed by a spin coat method.

As a second electrode, Ca film (5 nm) and Al film (100 nm) were formed by evaporation method next.

Barrier film was layered using plasma enhanced CVD technique next. After having layered a low density silicon nitride film (2.3 g/cm$^3$) of which thickness was 200 nm, a normal density barrier film (2.8 g/cm$^3$) of which thickness was 200 nm was layered.

The obtained organic electroluminescent element was stored under atmosphere of 60 degrees Celsius 90% RH for 1000 Hr.

There were little occurrence and enlargement of DS (a dark spot). There was little deterioration starting from an end of an electrode. The light emitting area was equal to or more than 90% of initial area.

After having stored an organic electroluminescent element for 2000 Hr, the light emitting area decreased to about 70%.

EXAMPLE 2

Except for a barrier film, an organic electroluminescent element of example 1 was made.

A low density silicon nitride film (2.3 g/cm$^3$) of which thickness was 200 nm was layered. At this point in the process, while just maintaining plasma, quantity of mono-silane was reduced slowly. Density was changed in this way. Then the density gradient film of which thickness was 200 nm was layered. At this point in the process, film density was 2.8 g/cm$^3$.

The obtained organic electroluminescent element was stored under atmosphere of 60 degrees Celsius 90% RH for 1000 Hr.

Most of the light emitting area did not decrease. The light emitting area was equal to or more than 85% of initial area.

After having stored an organic electroluminescent element for 2000 Hr, the light emitting area decreased to about 65%.

EXAMPLE 3

An organic electroluminescent element was made same as example 1.

Laminated films of two layers were further provided. Silicon nitride films of 4 layers in total were laminated.

The obtained organic electroluminescent element was stored under atmosphere of 60 degrees Celsius 90% RH for 1000 Hr.

Most of the light emitting area did not decrease. The light emitting area was 100% of initial area.

After having stored an organic electroluminescent element for 2000 Hr, the light emitting area decreased to about 90%.

EXAMPLE 4

An organic electroluminescent element was made same as example 2. One density gradient film was further formed.

The obtained organic electroluminescent element was stored under atmosphere of 60 degrees Celsius 90% RH for 1000 Hr.

Most of the light emitting area did not decrease. The light emitting area was 95% of initial area.

After having stored an organic electroluminescent element for 2000 Hr, the light emitting area decreased to about 85%.

EXAMPLE 5

An organic electroluminescent element was made same as example 1. Epoxy adhesive was used for adhesive 6. For sealing substrate 7, a glass substrate was used.

The obtained organic electroluminescent element was stored under atmosphere of 60 degrees Celsius 90% RH for 2000 Hr.

The reduction of light emitting area was not observed.

EXAMPLE 6

An organic electroluminescent element was made same as example 2. Epoxy adhesive was used for adhesive 6. For sealing substrate 7, a glass substrate was used.

The obtained organic electroluminescent element was stored under atmosphere of 60 degrees Celsius 90% RH for 2000 Hr.

The reduction of light emitting area was not observed.

Comparative example is explained successively.

COMPARATIVE EXAMPLE 1

A normal density barrier film (2.8 g/cm$^3$) of which thickness was 400 nm was layered without layering a low density silicon nitride film on an organic electroluminescent element of example 1.

After having stored the obtained organic electroluminescent element under atmosphere of 60 degrees Celsius 90% RH for 1000 Hr, the organic electroluminescent element did not emit light.

COMPARATIVE EXAMPLE 2

An organic electroluminescent element of comparative example 1 was used. Epoxy adhesive was used for adhesive 6. A glass substrate was used for sealing substrate 7.

The obtained organic electroluminescent element was stored under atmosphere of 60 degrees Celsius 90% RH for 2000 Hr.

By influence of the water-vapor in resins and permeated water-vapor from outside, the occurrence/enlargement of DS and the deterioration of electrode ends occurred.

The light emitting area decreased to around 50% of initial area.

EXAMPLE 7

Organic luminescent medium layer 3 was formed on glass substrate 1 on which ITO film 2 was formed. A film production of a polythiophene derivative (50 nm) was performed on glass substrate 1 as a polymer hole transport layer. A layer of poly fluorene (80 nm) was formed on a polymer hole transport layer as a polymer luminescent layer.

Ink was made by dissolving polythiophene in water and alcohol. Ink was made by dissolving poly fluorene in aromatic solvent such as toluene. Using each ink, each layer was formed by letterpress printing.

Second electrode 4 was formed next. Ca (10 nm) and Al (100 nm) were formed using evaporation method.

Barrier film 5 was formed using an parallel plate type plasma enhanced CVD apparatus afterwards. At first the substrate on which a cathode was formed was input inside of a vacuum chamber. Internal pressure of a vacuum chamber was depressurized to $10^{-2}$ Pa. Substrate was heated to 130 degrees Celsius using a substrate heater next. As source gas, silane 20 standard cc/min (referred to as sccm), nitrogen 500 sccm and hydrogen 200 sccm were introduced. Pressure was increased to 75 Pa. After pressure arrived at 75 Pa, a film production was performed by inputting electric power of 300 W to RF source immediately. Then the layer of which thickness was 300 nm was formed. The layer obtained in this way was water-vapor-proofing silicon nitride film 5a. Next, temperature of substrate was lowered to 80 degrees Celsius while having put an organic electroluminescent element in a vacuum chamber. Silane 30 sccm, nitrogen 500 sccm and hydrogen 50 sccm were introduced as source gas. After internal pressure became 75 Pa, a film production was performed by inputting electric power of 300 W to RF source immediately. Then the total film thickness became 110 nm. The layer obtained in this way was easily oxidative silicon nitride film 5b.

Barrier film 5 of four layers in total was formed by repeating two times of above-mentioned processes.

A glass substrate was put on barrier film 5.

Thermosetting resin was applied to whole area of a glass substrate by die coater beforehand. When a glass substrate was put on an element substrate, heated roll laminater was used at 100 degrees.

After having put a glass substrate, thermosetting resin was further hardened at 100 degrees Celsius for 1 hr.

Humidity resistance of an organic electroluminescent element obtained in this way was evaluated.

An organic electroluminescent element was examined under atmosphere of 85 degrees Celsius 90% RH.

As a result, there was not reduction of light emitting area after 3000 hours. The sealing ability of the present embodiment was same as sealing ability of a glass cap with desiccant.

On the other hand, barrier film 5 of which thickness was 150 nm was formed on a glass substrate. A transmissivity of formed barrier film was measured with a spectrophotometer. Average value of a visible light transmissivity was equal to or more than 90%. (R (700 nm):95%, G (546 nm): 94%, B (436 nm): 87%)

Therefore, barrier film 5 was almost transparent.

In other words light can be taken out from this barrier film side without attenuating light.

EXAMPLE 8

Instead of barrier film 5 of example 7, the following barrier film was used: Easily oxidative silicon nitride film 5b formed in the shape of a frame; and Water-vapor-proofing silicon nitride film 5a which is formed to coat the frame.

At first substrate on which each layer except for a barrier film was formed was prepared. An organic luminescent medium layer area of this substrate was masked by alumina mask. This substrate was input in a vacuum chamber afterwards. Till internal-pressure of a vacuum chamber reached $10^{-2}$ Pa, a vacuum chamber was depressurized. Temperature of a substrate was set to 80 degrees Celsius afterwards. Silane 30 sccm, nitrogen 500 sccm and hydrogen 50 sccm were introduced as source gas. The pressure became 75 Pa. After the pressure arrived at 75 Pa, a film production was performed by inputting high-RF power 300 W immediately. Film thickness of barrier film 5 was set to be 3 μm so that barrier film 5 could capture effectively the water-vapor entering from an end. The layer made in this way was easily oxidative silicon nitride film 5b. A mask was removed from substrate next. Temperature of a substrate was heated to 130 degrees Celsius afterwards. Silane 20 sccm, nitrogen 500 sccm and hydrogen 200 sccm were introduced as source gas. After a pressure became 75 Pa, a film production was performed by inputting electric power of 300 W to RF source immediately. The layer made in this way was water-vapor-proofing silicon nitride film 5a.

Same as example 7, a glass substrate was put on barrier film 5.

Humidity resistance of an obtained organic electroluminescent element was evaluated.

An organic electroluminescent element was examined under atmosphere of 85 degrees Celsius 90% RH.

As a result, there was not reduction of light emitting area after 3000 hr. The sealing ability of the present embodiment was same sealing ability as a glass cap with desiccant.

COMPARATIVE EXAMPLE 3

Water-vapor-proofing silicon nitride film 5a of example 7 was used as barrier film 5 of example 7. The film thickness of barrier film 5 was 800 nm. An organic electroluminescent element was sealed by putting a glass substrate on barrier film 5.

An obtained organic electroluminescent element was stored under atmosphere of 85 degrees Celsius 90% RH.

Reduction of light emitting area started from 800 hr. 6% reduction of initial light emitting area was observed after 1000 hr. 60% reduction of initial light emitting area was observed after 3000 hr.

COMPARATIVE EXAMPLE 4

Only easily oxidative silicon nitride film 5b of example 7 was layered as barrier film 5 of example 7. The film thickness of barrier film 5 was 800 nm. An organic electroluminescent element was sealed by putting a glass substrate on barrier film 5.

An obtained organic electroluminescent element was stored under atmosphere of 85 degrees Celsius 90% RH.

Reduction of light emitting area started from 800 hr. 25% reduction of initial light emitting area was observed after 1000 hr. The organic electroluminescent element did not light after 3000 hr.

COMPARATIVE EXAMPLE 5

Barrier film 5 was not made on a substrate used in example 7. An organic electroluminescent element was sealed by putting a glass substrate on a cathode directly.

An obtained organic electroluminescent element was stored under atmosphere of 85 degrees Celsius 90% RH.

Reduction of light emitting area started from 800 hr. 25% reduction of initial light emitting area was observed after 1000 hr. The organic electroluminescent element did not light after 3000 hr.

EXAMPLE 9

The ITO film of which thickness was 100 nm was formed on the organic luminescent medium layer of example 7 by sputtering as a cathode. Barrier film 5 which was same as the barrier film of example 7 was formed on the cathode.

Luminance in the case light was emitted from the upper side (the barrier film side) was compared with luminance in the case light was emitted from lower side (the substrate side).

Luminance in the case light was emitted from upper side was assumed 1. Then luminance in the case light was taken out of lower side was 0.95. It was able to be confirmed that there was not almost a difference between both cases.

What is claimed is:

1. An organic electroluminescent element including
a substrate,
a first electrode on the substrate,
an organic luminescent medium layer including an organic luminescent layer on the first electrode,
a second electrode on the organic luminescent medium layer
and
a barrier film formed on the second electrode, the barrier film consisting of silicon nitride, film density of the barrier film changing in thickness direction, the film density of the barrier film of the second electrode side being smaller than the film density of the barrier film of the opposite side of the second electrode side,
wherein the organic luminescent medium layer is sandwiched between the first electrode and the second electrode, and
wherein the film density of the barrier film is a density gradient film where film density changes continually.

2. The organic electroluminescent element according to claim 1,
wherein a low density film included in the barrier film is in the second electrode side and a high density film included in the barrier film is in the opposite side of the second electrode side.

3. The organic electroluminescent element according to claim 1,
wherein absolute value of film stress of the barrier film is equal to or less than 100 MPa.

4. The organic electroluminescent element according to claim 1,
wherein an adhesive and a sealing substrate are laminated on the barrier film.

5. The organic electroluminescent element according to claim 1,
wherein the barrier film is a plurality of layers.

6. A manufacturing method of an organic electroluminescent element according to claim 1,
wherein the silicon nitride film is layered by CVD where a flow rate of mono-silane changed so that density of the silicon nitride film is changed.

7. A manufacturing method of an organic electroluminescent element according to claim 1,
wherein the silicon nitride film is layered by CVD where all gas pressure is changed so that density of the silicon nitride film is changed.

8. An organic electroluminescent element including
a substrate,
a first electrode on the substrate,
an organic luminescent medium layer including an organic luminescent layer on the first electrode,
a second electrode on the organic luminescent medium layer
and
a barrier film formed on the second electrode, the barrier film consisting of silicon nitride, film density of the barrier film changing in thickness direction, the film density of the barrier film of the second electrode side being smaller than the film density of the barrier film of the opposite side of the second electrode side,
wherein the organic luminescent medium layer is sandwiched between the first electrode and the second electrode, and
wherein the film density of the barrier film of the second electrode side is 2.1-2.6 $g/m^3$.

9. The organic electroluminescent element according to claim 8,
wherein a low density film included in the barrier film is in the second electrode side and a high density film included in the barrier film is in the opposite side of the second electrode side.

10. The organic electroluminescent element according to claim 8,
wherein absolute value of film stress of the barrier film is equal to or less than 100 MPa.

11. The organic electroluminescent element according to claim 8,
wherein an adhesive and a sealing substrate are laminated on the barrier film.

12. The organic electroluminescent element according to claim 8,
wherein the barrier film is a plurality of layers.

13. A manufacturing method of an organic electroluminescent element according to claim 8,
wherein the silicon nitride film is layered by CVD where a flow rate of mono-silane is changed so that density of the silicon nitride film is changed.

14. A manufacturing method of an organic electroluminescent element according to claim 8,
wherein the silicon nitride film is layered by CVD where all gas pressure is changed so that density of the silicon nitride film is changed.

15. A manufacturing method of an organic electroluminescent element including a substrate, and a first electrode, an organic luminescent medium layer, a second electrode and barrier film formed on the substrate,
wherein the barrier film comprises a water-vapor-proofing silicon nitride film and an oxidative silicon nitride film,
said method includes forming the water-vapor-proofing silicon nitride film and the oxidative silicon nitride film by a plasma enhanced CVD method, and
wherein the oxidative silicon nitride film is formed in the case that temperature of the substrate in a film production is from a room temperature to 100 degrees Celsius.

\* \* \* \* \*